(12) United States Patent
Kuroda et al.

(10) Patent No.: US 10,534,015 B2
(45) Date of Patent: Jan. 14, 2020

(54) SENSOR AND METHOD FOR DIAGNOSING SENSOR

(71) Applicant: Panasonic Intellectual Property Management Co., Ltd., Osaka (JP)

(72) Inventors: Keisuke Kuroda, Fukui (JP); Takeshi Mori, Fukui (JP)

(73) Assignee: PANASONIC INTELLECTUAL PROPERTY MANAGEMENT CO., LTD, Osaka (JP)

( * ) Notice: Subject to any disclaimer, the term of this patent is extended or adjusted under 35 U.S.C. 154(b) by 141 days.

(21) Appl. No.: 15/159,798

(22) Filed: May 19, 2016

(65) Prior Publication Data

US 2017/0336438 A1    Nov. 23, 2017

(51) Int. Cl.
| | |
|---|---|
| *G01P 21/00* | (2006.01) |
| *G01C 25/00* | (2006.01) |
| *G01C 19/5614* | (2012.01) |
| *H03L 7/06* | (2006.01) |

(52) U.S. Cl.
CPC .......... *G01P 21/00* (2013.01); *G01C 19/5614* (2013.01); *G01C 25/005* (2013.01); *H03L 7/06* (2013.01)

(58) Field of Classification Search
CPC .......... G01P 2/00; G01P 21/00; G01C 25/005
USPC .......................................................... 73/1.37
See application file for complete search history.

(56) References Cited

U.S. PATENT DOCUMENTS

| | | | | |
|---|---|---|---|---|
| 5,459,432 A | * | 10/1995 | White | ............... G01C 19/5607 329/307 |
| 2005/0175195 A1 | * | 8/2005 | Cheney, Jr. | .......... G01R 31/041 381/120 |

FOREIGN PATENT DOCUMENTS

| | | |
|---|---|---|
| JP | 5-223844 | 9/1993 |
| JP | 2003-264460 | 9/2003 |
| JP | 2013-079972 | 5/2013 |
| WO | 2015/128922 | 9/2015 |

* cited by examiner

*Primary Examiner* — Justin Seo
*Assistant Examiner* — Rodney T Frank
(74) *Attorney, Agent, or Firm* — McDermott Will & Emery LLP

(57) ABSTRACT

A sensor is provided including: an element outputting detection signals according to magnitude of physical quantity; a drive circuit outputting a driving signal to the element and receiving a monitor signal from the element; a detection circuit that includes amplifiers amplifying the detection signals and a first synchronous demodulation circuit performing synchronous demodulation on a signal from the amplifier, receives the detection signals, and outputs a physical quantity signal according to the physical quantity; a processing circuit processing a signal from the first synchronous demodulation circuit; a first diagnostic circuit that receives a signal into the processing circuit and a signal from the processing circuit, and outputs a first error signal when abnormalities occur in the processing circuit; and a second diagnostic circuit that outputs a diagnostic signal to the first diagnostic circuit, instead of the signal into the processing circuit or instead of the signal from the processing circuit.

18 Claims, 13 Drawing Sheets

SENSOR AND METHOD FOR DIAGNOSING SENSOR

BACKGROUND

1. Technical Field

The present disclosure relates to a sensor used for a vehicle and the like, and a method for diagnosing the sensor.

2. Description of the Related Art

A conventionally known sensor displaces a movable electrode with an electrostatic force-generating unit and diagnoses whether the sensor is operating normally based on a change in capacitance caused by this displacement. As a prior art literature related to such a sensor, for example, Patent Literature 1 (Unexamined Japanese Patent Publication No. H05-223844) and Patent Literature 2 (WO 2015/128922) are known.

Alternatively, a known sensor diagnoses whether the sensor is operating normally based on a signal after synchronous demodulation. As a prior art literature related to such a sensor, for example, Patent Literature 3 (Unexamined Japanese Patent Publication No. 2013-79972) is known.

Alternatively, a known sensor diagnoses whether the sensor is operating normally by outputting an alarm signal when a comparison result is outside a prescribed range between a signal obtained through division of a clock and a signal obtained through division of an output clock of a voltage controlled oscillator. As a prior art literature related to such a sensor, for example, Patent Literature 4 (Unexamined Japanese Patent Publication No. 2003-264460) is known.

However, as increased sensor safety is required, conventional sensors are insufficient for ensuring safety.

Therefore, an object of the present disclosure is to provide a sensor with increased safety.

SUMMARY

In order to achieve the aforementioned object, the present disclosure is a sensor including: an element that outputs a detection signal according to magnitude of a physical quantity; a drive circuit that outputs a driving signal to the element and receives a monitor signal from the element; a detection circuit including an amplifier that amplifies the detection signal and a first synchronous demodulation circuit that performs synchronous demodulation on a signal from the amplifier, the detection circuit receiving the detection signal and outputting a physical quantity signal according to the physical quantity; a processing circuit that processes a signal from the first synchronous demodulation circuit; a first diagnostic circuit that receives a signal that is input into the processing circuit and a signal that is output from the processing circuit, the first diagnostic circuit outputting a first error signal when an abnormality occurs in the processing circuit; and a second diagnostic circuit that outputs a diagnostic signal to the first diagnostic circuit, instead of the signal that is input into the processing circuit, or instead of the signal that is output from the processing circuit.

The sensor of the present disclosure produces an effect of improving safety.

DETAILED DESCRIPTION

A sensor according to the present exemplary embodiment will be described below with reference to the drawings.

Figure 1:
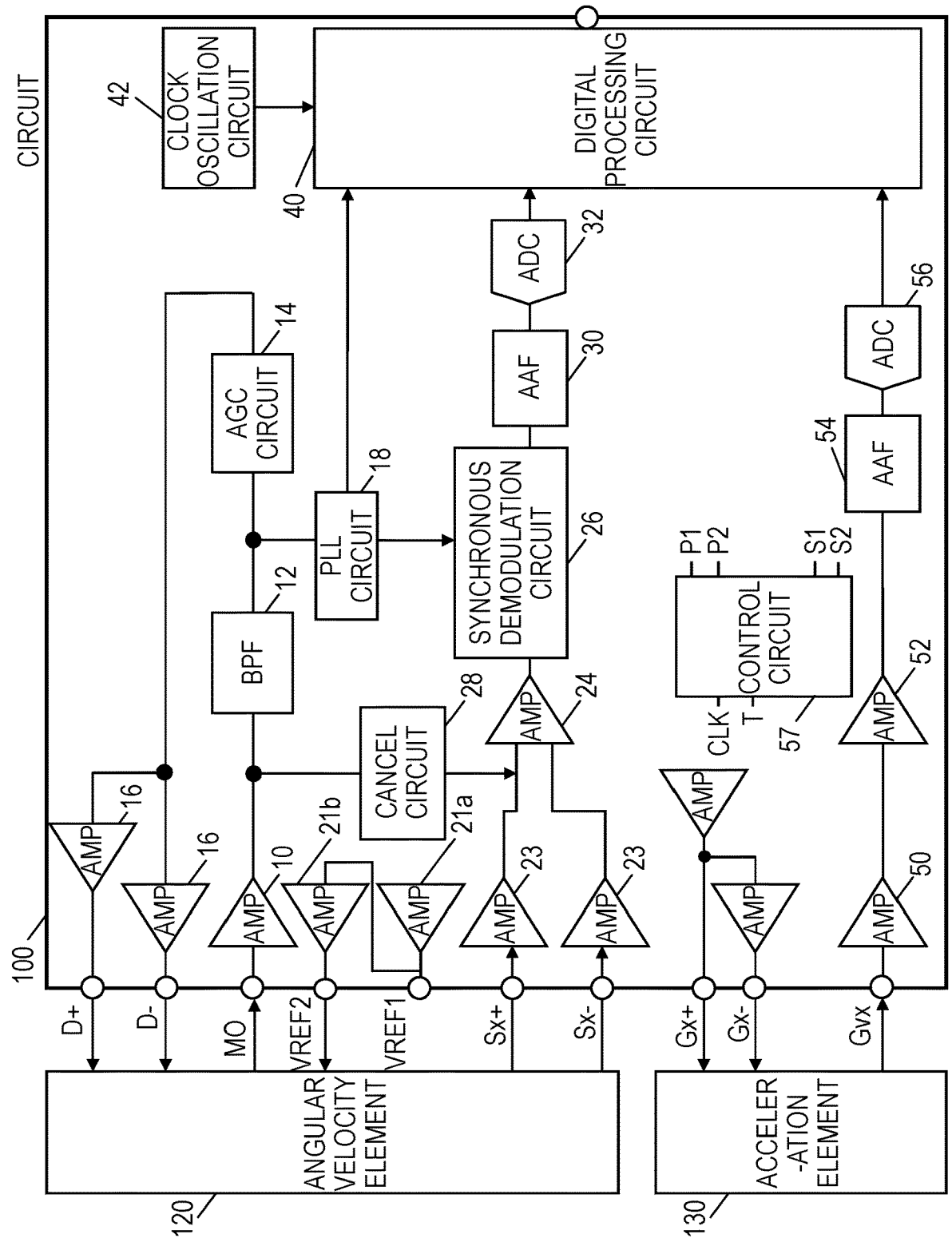
FIG. 1 is a block diagram illustrating a basic configuration of a sensor according to an exemplary embodiment.
Figure 2:
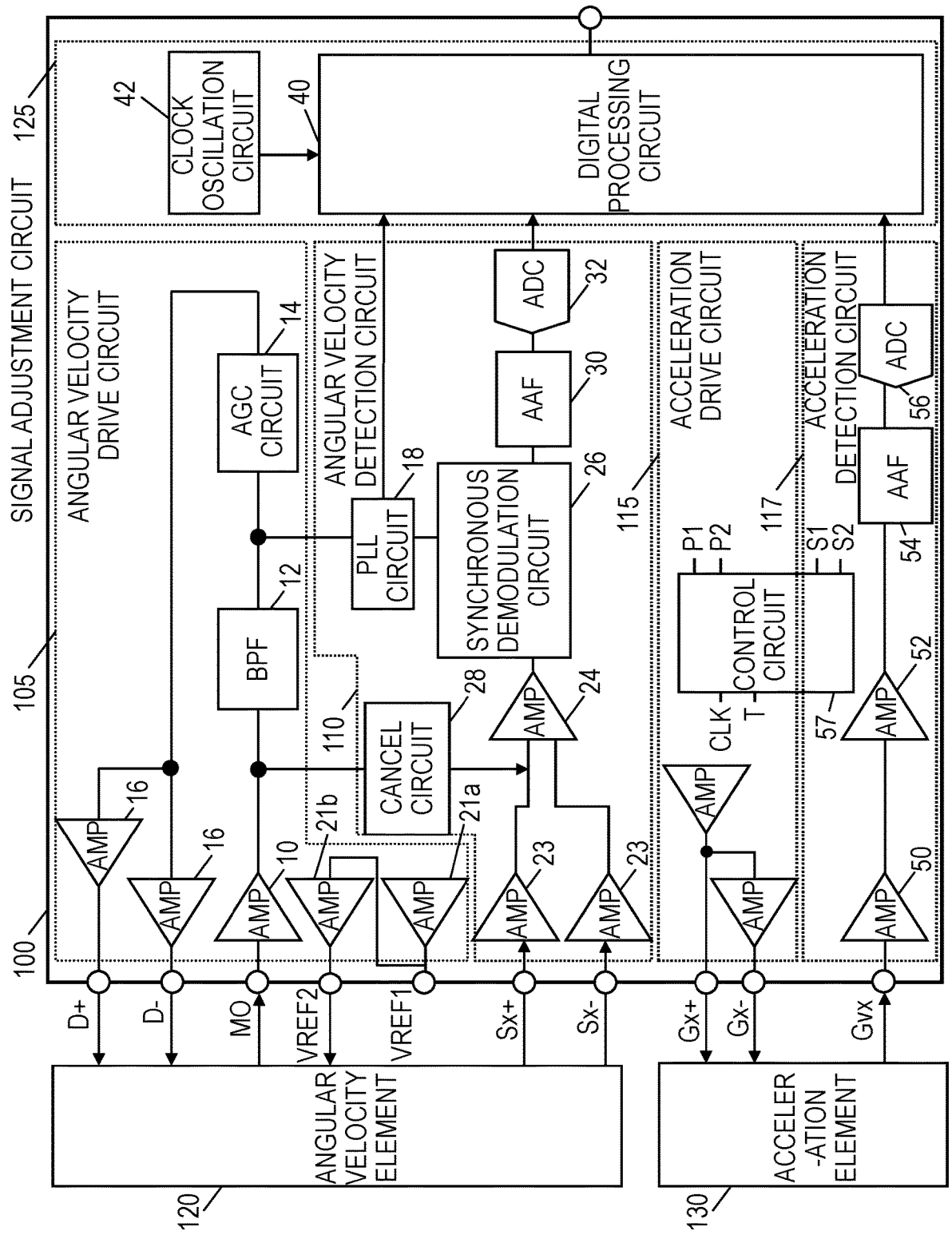
FIG. 2 is a block diagram separately illustrating each function of the basic configuration of the sensor according to the exemplary embodiment.

FIG. 1 is a block diagram illustrating a basic configuration of a sensor according to an exemplary embodiment. FIG. 2 is a block diagram separately illustrating each function of the basic configuration of the sensor according to the exemplary embodiment.

In the following description, the following names are given to electric signals. "Driving signals" mean signals from angular velocity drive circuit 105 to angular velocity element 120, or signals from acceleration drive circuit 115 to acceleration element 130. "Detection signals" mean signals from angular velocity element 120 to angular velocity detection circuit 110, or signals from acceleration element 130 to acceleration detection circuit 117. A "diagnostic signal" means a signal from a diagnostic circuit to a circuit to be diagnosed. A "response signal" means a signal from the circuit to be diagnosed to the diagnostic circuit. An "error signal" means a signal that is output from the diagnostic circuit when an abnormality occurs. A "physical quantity signal" means a signal that is output from angular velocity detection circuit 110 or acceleration detection circuit 117 according to physical quantity that acts on the sensor.

FIG. 1 and FIG. 2 describe the configuration necessary for explaining a basic operation of the sensor (basic configuration), and various diagnostic circuits are omitted.

In the drawings, an amplifier is denoted as "AMP", a band pass filter is denoted as "BPF", an anti-aliasing filter is denoted as "AAF", an analog-to-digital (A/D) conversion circuit is denoted as "ADC", an automatic gain control circuit is denoted as "AGC circuit", and a phase-locked loop circuit is denoted as "PLL circuit".

As illustrated in FIG. 1, the sensor according to the present exemplary embodiment includes angular velocity element 120 that outputs signals resulting from angular velocity (angular velocity detection signals), acceleration element 130 that outputs a signal resulting from acceleration (acceleration detection signal), and circuit 100 electrically connected to angular velocity element 120 and acceleration element 130.

As illustrated in FIG. 2, circuit 100 includes angular velocity drive circuit 105, angular velocity detection circuit 110, acceleration drive circuit 115, acceleration detection circuit 117, and signal adjustment circuit 125.

Angular velocity drive circuit 105 inputs the driving signals (denoted as "D+, D−" in the drawing) into angular velocity element 120 to drive angular velocity element 120 to oscillate at a specific frequency (drive frequency). In addition, angular velocity drive circuit 105 receives a monitor signal (denoted as "MO" in the drawing) from angular velocity element 120. The monitor signal is a signal generated by drive oscillation, and is a signal representing a state of oscillation of angular velocity element 120.

Angular velocity detection circuit 110 receives angular velocity detection signals (denoted as "Sx+, Sx−" in the drawing) from angular velocity element 120. The input angular velocity detection signals are electrically processed by angular velocity detection circuit 110, and then the processed angular velocity detection signals are output as a physical quantity signal representing angular velocity. The angular velocity detection signals are signals generated by angular velocity applied to angular velocity element 120.

Acceleration drive circuit 115 inputs carrier signals (denoted as "Gx+, Gx−" in the drawing) into acceleration element 130.

Acceleration detection circuit 117 receives an acceleration detection signal (denoted as "Gvx" in the drawing) from acceleration element 130. The input acceleration detection signal is electrically processed by acceleration detection circuit 117, and then the processed acceleration detection signal is output as a physical quantity signal representing angular velocity. The acceleration detection signal is a signal generated by acceleration provided to acceleration element 130.

Angular velocity drive circuit 105 includes amplifier 10, band pass filter 12, automatic gain control circuit 14, and amplifiers 16.

Amplifier 10 receives a signal (monitor signal) that is output from monitor electrode 128 (refer to FIG. 12) included in angular velocity element 120.

Band pass filter 12 receives a signal that is output from amplifier 10. Band pass filter 12 allows a signal of a frequency identical to the drive frequency of angular velocity element 120 to pass therethrough, and band pass filter 12 attenuates a signal of a frequency different from the drive frequency (for example, this signal is an unwanted signal resulting from mechanical resonance). Band pass filter 12 may be disposed at any place as long as the place is within angular velocity drive circuit 105.

Automatic gain control circuit 14 includes, within automatic gain control circuit 14, a rectifier (unillustrated) that receives a signal that is output from band pass filter 12, and a smoothing circuit (unillustrated) that receives a signal that is output from this rectifier. Based on magnitude of a signal that is output from this smoothing circuit, automatic gain control circuit 14 performs control for amplifying or attenuating the signal that is output from band pass filter 12. In more detail, this control refers to increasing a gain of automatic gain control circuit 14 to increase amplitude of the driving signals, when amplitude of the monitor signal is small. Thus, by increasing amplitude of drive oscillation to be provided to angular velocity element 120, control is performed for increasing amplitude of the monitor signal. On the contrary, when the amplitude of the monitor signal is large, the gain of automatic gain control circuit 14 is decreased to decrease the amplitude of the driving signals. Thus, by decreasing the amplitude of the drive oscillation to be provided to angular velocity element 120, control is performed for decreasing the amplitude of the monitor signal. These types of control maintain the amplitude of the driving signals (that is, magnitude of the drive oscillation of angular velocity element 120) to be almost constant.

Amplifier 16 receives a signal that is output from automatic gain control circuit 14. In addition, amplifier 16 outputs the driving signals for driving angular velocity element 120 to driving electrode 126 (refer to FIG. 12).

Angular velocity detection circuit 110 includes PLL circuit 18, amplifiers 23, cancel circuit 28, amplifier 24, synchronous demodulation circuit 26, anti-aliasing filter 30 (filter circuit), and A/D conversion circuit 32.

PLL circuit 18 receives the signal that is output from band pass filter 12. PLL circuit 18 generates a PLL output signal synchronized with a phase of the input signal, with a frequency obtained through multiplication of a frequency of the input signal. In addition, PLL circuit 18 also generates a clock signal (demodulation signal) with timing of the PLL output signal 90° out of phase with the monitor signal (in other words, output signal of band pass filter 12). The clock signal (demodulation signal) is input into synchronous demodulation circuit 26 described later.

Amplifiers 23 amplify the angular velocity detection signals that are output from detection electrode 124 (refer to FIG. 12), and then output the amplified angular velocity detection signals to amplifier 24 described later.

Cancel circuit 28 outputs a cancel signal. The cancel signal is generated through previous measurement and storage of a noise signal in a memory (unillustrated), and reading of a value of the stored noise signal. This cancel signal is a signal for offsetting unwanted signal components included in the angular velocity detection signals. The cancel signal is added to the angular velocity detection signals that are output from amplifiers 23. This offsets (cancels) the noise signal included in the angular velocity detection signals. The noise signal mentioned here is a signal that appears in the angular velocity detection signals by the drive oscillation deforming angular velocity element 120 by mechanical coupling (MC). This signal is a noise signal resulting from poorly balanced mass of angular velocity element 120 (asymmetry of an element shape). For example, for a tuning fork-type element (to be described in detail later), which is an example of angular velocity element 120 of the present exemplary embodiment, a difference in mass between a left arm and a right arm generates the noise signal.

Amplifier 24 is a differential amplifier, and receives signals that are output from amplifiers 23. The received signals undergo differential amplification by amplifier 24.

Synchronous demodulation circuit 26 outputs, to anti-aliasing filter 30, a signal obtained through multiplication of the clock signal that is output from PLL circuit 18 and the signal that is output from amplifier 24. This signal is denoted as an "angular velocity detection signal".

Anti-aliasing filter 30 outputs, to A/D conversion circuit 32, a signal obtained through elimination of high-frequency components from the angular velocity detection signal that is output from synchronous demodulation circuit 26. This signal is denoted as "angular velocity signal".

A/D conversion circuit 32 performs A/D conversion on the angular velocity signal that is output from anti-aliasing filter 30 to output the converted angular velocity signal to digital processing circuit 40.

Figure 13:
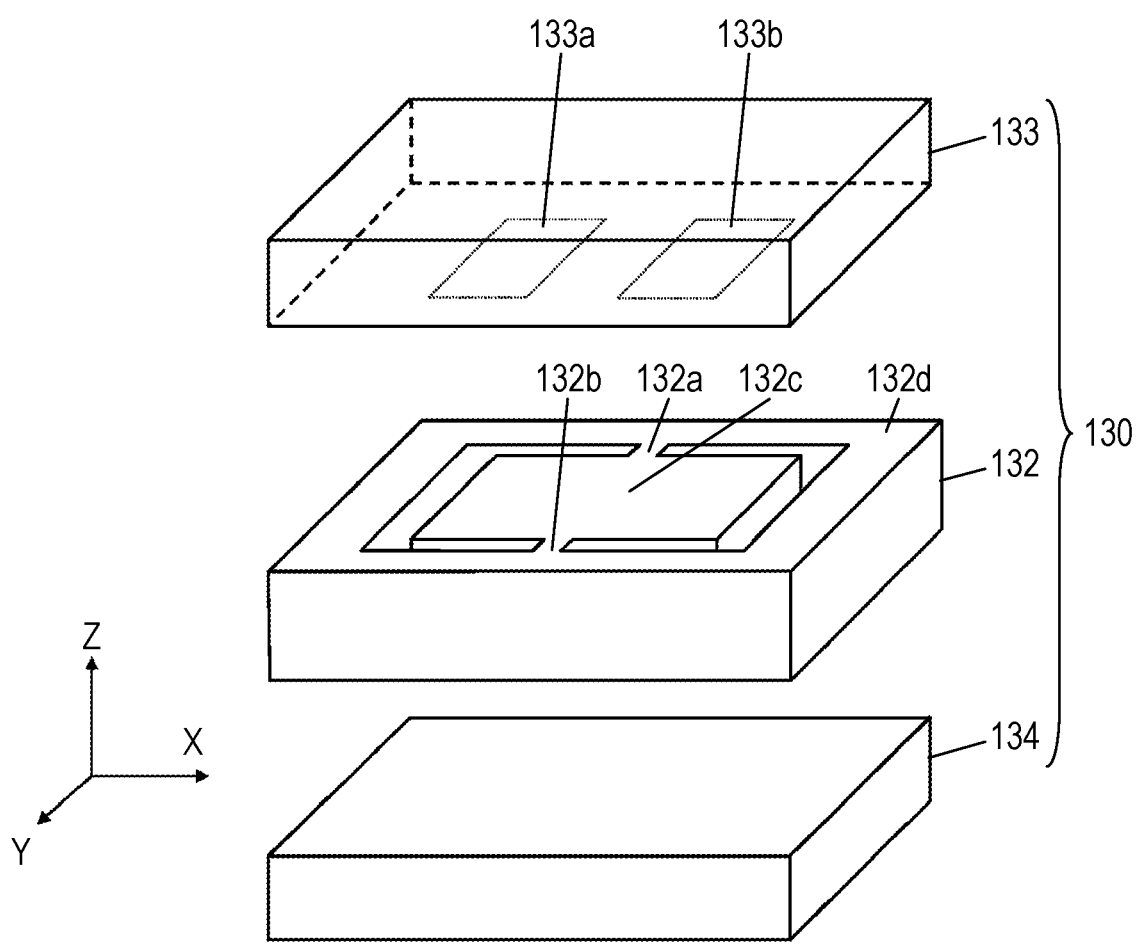
FIG. 13 is an exploded perspective view illustrating an acceleration element included in the sensor according to the present exemplary embodiment.

Acceleration drive circuit 115 inputs the carrier signal between movable electrode 132c and first stationary electrode 133a and between movable electrode 132c and second stationary electrode 133b, of acceleration element 130 (refer to FIG. 13).

Acceleration detection circuit 117 includes amplifier 50, amplifier 52, anti-aliasing filter 54, and A/D conversion circuit 56.

Amplifier 50 receives the acceleration detection signal from acceleration element 130. Amplifier 50 amplifies a voltage signal according to a change in capacitance between movable electrode 132c and first stationary electrode 133a, and between movable electrode 132c and second stationary electrode 133b, and then amplifier 50 outputs the amplified voltage signal to amplifier 52.

Amplifier 52 amplifies the voltage signal from amplifier 50. Details of amplifier 52 will be described later.

Anti-aliasing filter 54 outputs a signal with noise components attenuated from a signal that is output from amplifier 52, the noise components at a frequency band equal to or higher than ½ of a sampling frequency of downstream A/D conversion circuit 56. The signal that is output from anti-aliasing filter 54 is denoted as "acceleration signal".

A/D conversion circuit 56 performs A/D conversion on the acceleration signal from anti-aliasing filter 54, and outputs the converted acceleration signal to digital processing circuit 40.

Signal adjustment circuit 125 includes clock oscillation circuit 42 and digital processing circuit 40.

Clock oscillation circuit 42 generates an internal clock for circuit 100. The internal clock is used for an operation of digital processing circuit 40 and an operation of A/D conversion and the like in A/D conversion circuit 56.

Digital processing circuit 40 performs various kinds of calculation, such as offset adjustment, gain adjustment, and digital filter calculation on the angular velocity signal from A/D conversion circuit 32. Alternatively, digital processing circuit 40 performs electric communication with outside, control of various registers, and the like.

Figure 3:
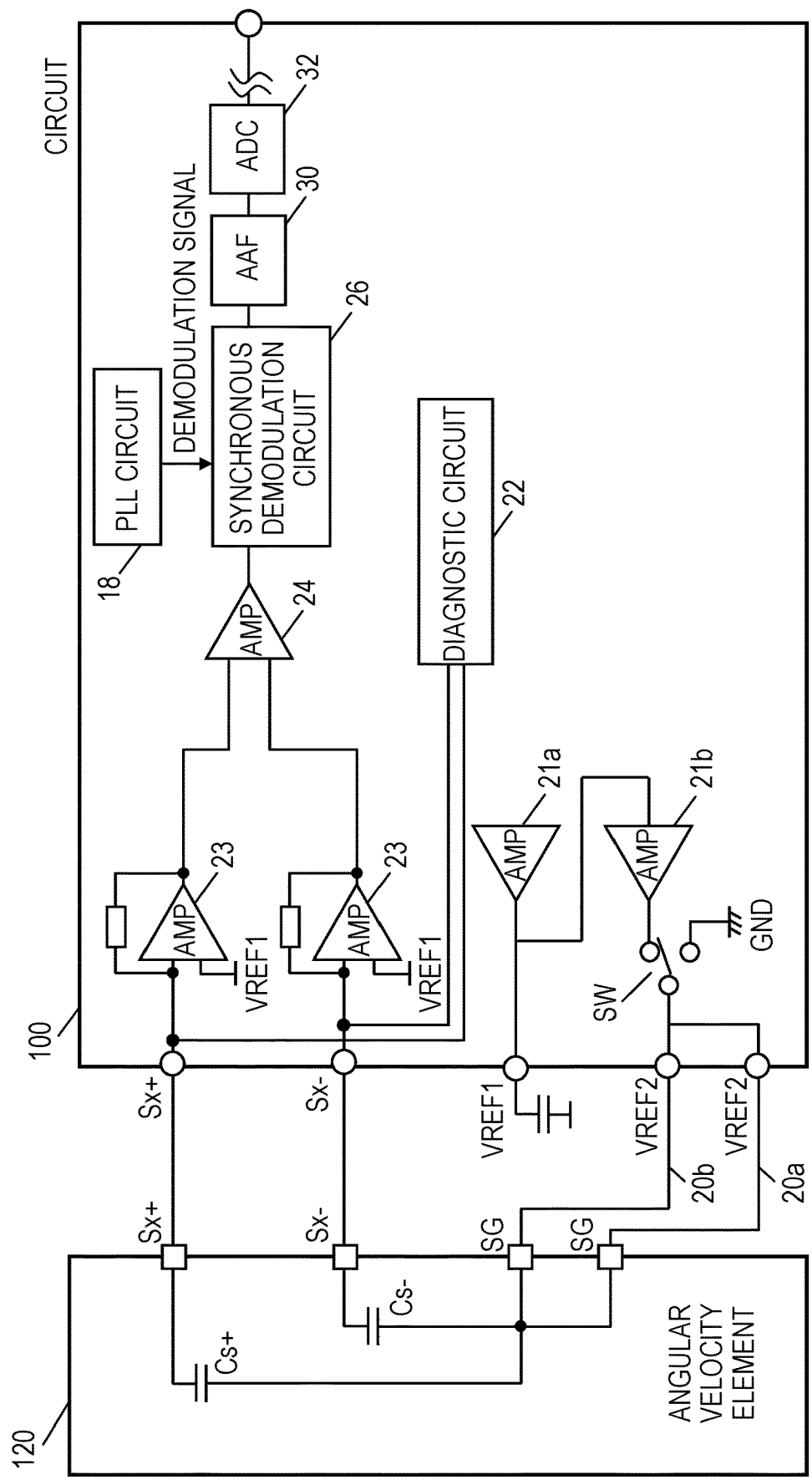
FIG. 3 is a block diagram illustrating in detail part of the configuration of the sensor according to the exemplary embodiment.

FIG. 3 is a block diagram illustrating in detail part of the configuration of the sensor according to the exemplary embodiment.

As illustrated in FIG. 3, circuit 100 includes first amplifier 21a that outputs a first voltage (Vref1), and second amplifier 21b that outputs a second voltage (Vref2).

The first voltage (Vref1) is a reference voltage to be used for an operation of circuit 100. A terminal that outputs the first voltage is connected to a capacitor.

The second voltage (Vref2) is a reference voltage for angular velocity element 120. First wire 20a and second wire 20b electrically connect terminals that output the second voltage (Vref2) to angular velocity element 120. First wire 20a and second wire 20b may be interpreted as first path 20a and second path 20b, respectively. The second voltage (Vref2) is generated, for example, through resistive division of a voltage between a power supply voltage and a ground. The second voltage (Vref2) is provided to angular velocity element 120. The second voltage (Vref2) and the driving signals that are output from angular velocity drive circuit 105 generate drive oscillation of angular velocity element 120. Here, the second voltage (Vref2) may be represented as "reference voltage".

In general, a break in the wire that provides the second voltage (Vref2) to the angular velocity element causes the sensor to stop the operation immediately. However, since the sensor illustrated in FIG. 3 includes two redundant wires 20a, 20b that provide the second voltage (Vref2) to angular velocity element 120, the sensor is unlikely to stop the operation, which improves safety of the sensor.

Meanwhile, circuit 100 has a switch SW. This switch SW generates a voltage pulse by switching the second voltage (Vref2) provided to angular velocity element 120 to a ground voltage, and provides this voltage pulse to angular velocity element 120. In a case where this voltage pulse is provided to angular velocity element 120, when angular velocity element 120 is operating normally, angular velocity detection circuit 110 detects an output change according to the voltage pulse. On the other hand, in a case where an abnormality occurs, such as a break in wires 20a, 20b that provide the second voltage (Vref2) to angular velocity element 120, even if this voltage pulse is provided to angular velocity element 120, angular velocity detection circuit 110 does not detect an electric change according to the voltage pulse. Thus, an abnormality of the sensor may be detected using the electric change according to the voltage pulse. The sensor illustrated in FIG. 3 further includes diagnostic circuit 22 that makes a diagnosis based on the electric change that occurs in angular velocity detection circuit 110 when this pulse voltage is applied to angular velocity element 120. This improves safety of the sensor.

Figure 4:
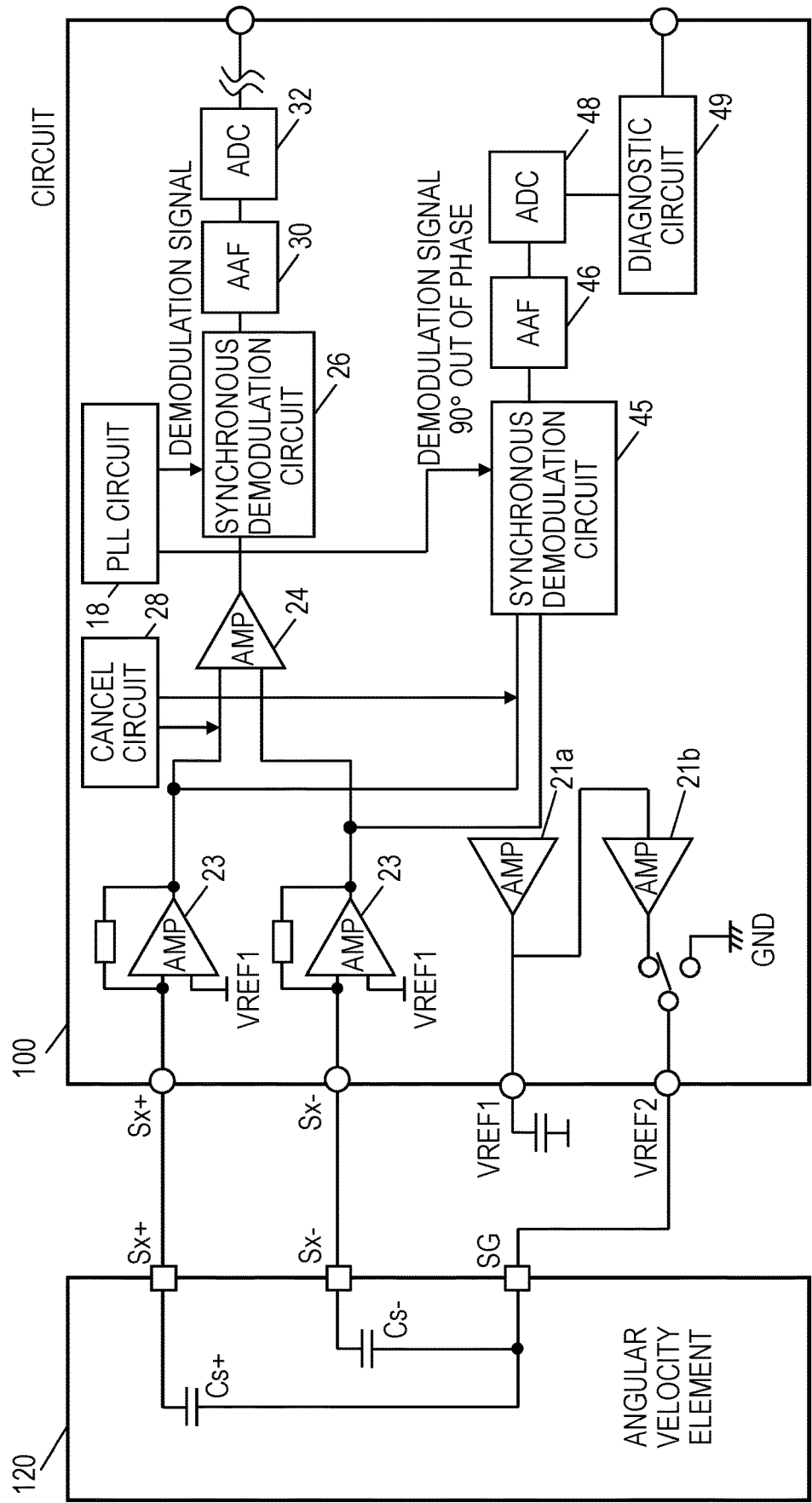
FIG. 4 is a block diagram illustrating in detail part of the configuration of the sensor according to the exemplary embodiment.

FIG. 4 is a block diagram illustrating in detail part of the configuration of the sensor according to the exemplary embodiment.

Control circuit 57 (refer to FIG. 2) includes synchronous demodulation circuit 45 (second synchronous demodulation circuit) that extracts the unwanted signal from the angular velocity detection signals, anti-aliasing filter 46 that receives a signal from synchronous demodulation circuit 45, A/D conversion circuit 48 (second A/D conversion circuit) that receives a signal from anti-aliasing filter 46, and diagnostic circuit 49 that receives a signal from AM conversion circuit 48.

In addition, cancel circuit 28 also inputs (adds) the aforementioned cancel signal to a signal between amplifier 23 and synchronous demodulation circuit 45.

Synchronous demodulation circuit 45 demodulates the signal to which the cancel signal is added by using a signal 90° out of phase with the driving signal (in other words, the demodulation signal that is input into synchronous demodulation circuit 26 from PLL circuit 18, in still other words, the demodulation signal to be used for detection of the angular velocity). This allows synchronous demodulation circuit 26 to pass the unwanted signal components substantially in phase with the driving signal, and cuts angular velocity signal components substantially 90° out of phase with the driving signal.

Diagnostic circuit 49 diagnoses presence of an open fault (abnormality) between angular velocity element 120 and circuit 100. An operation of diagnostic circuit 49 will be specifically described below.

First, in a normal state (in a state where abnormalities do not occur), addition of the cancel signal from cancel circuit 28 causes the unwanted signal (description of the unwanted signal is identical to the aforementioned description) included in output of each amplifier 23 to be canceled to almost zero. However, when an open fault occurs between angular velocity element 120 and circuit 100, a signal on a broken wire side is no longer input into amplifier 23 (is not output from amplifier 23). This results in that a noise signal component included in the signal on the broken wire side is also no longer input into amplifier 23 (is not output from amplifier 23). Meanwhile, however, an operation of cancel circuit 28 is not affected by the wire break, and thus cancel circuit 28 continues the operation to add the cancel signal to an output side of amplifier 23 even after occurrence of the wire break. As a result, on the side on which the wire break occurs, the cancel signal added to a signal between amplifier 23 and synchronous demodulation circuit 45 remains without being canceled. This cancel signal that remains without being canceled is input into synchronous demodulation circuit 45. That is, occurrence of the wire break leads to increase in a signal that is output from synchronous demodulation circuit 45. Detection (monitoring) of this change by diagnostic circuit 49 allows determination of the open fault (abnormality). That is, when a signal that is input from A/D conversion circuit 48 exceeds a predetermined value, diagnostic circuit 49 outputs an error signal.

Meanwhile, since synchronous demodulation circuit 45 receives the signal (this signal has a range smaller than a conventional signal) that does not include the noise signal, an input full-scale voltage of downstream A/D conversion circuit 48 may be small. Therefore, although A/D conversion circuit 48 has identical A/D conversion resolution, A/D conversion circuit 48 may have a number of bits less than the number of bits of A/D conversion circuit 32 (first A/D conversion circuit). Therefore, the sensor illustrated in FIG. 4 may be equipped with a diagnostic function while inhibiting increase in a circuit area.

Meanwhile, this method for diagnosis may also be described as follows. This method for diagnosis includes the steps of adding the cancel signal to the signal that is output from amplifier 23, performing synchronous demodulation on the signal obtained in the step of adding the cancel signal by using a signal 90° out of phase with the driving signal, and detecting (monitoring) the signal obtained in the step of performing the synchronous demodulation. In other words, the signal 90° out of phase with the driving signal is a signal 90° out of phase with the demodulation signal that is input from PLL circuit 18 into synchronous demodulation circuit 26. In still other words, the signal 90° out of phase with the driving signal is a signal 90° out of phase with the demodulation signal used for demodulation of the angular velocity.

Figure 5:
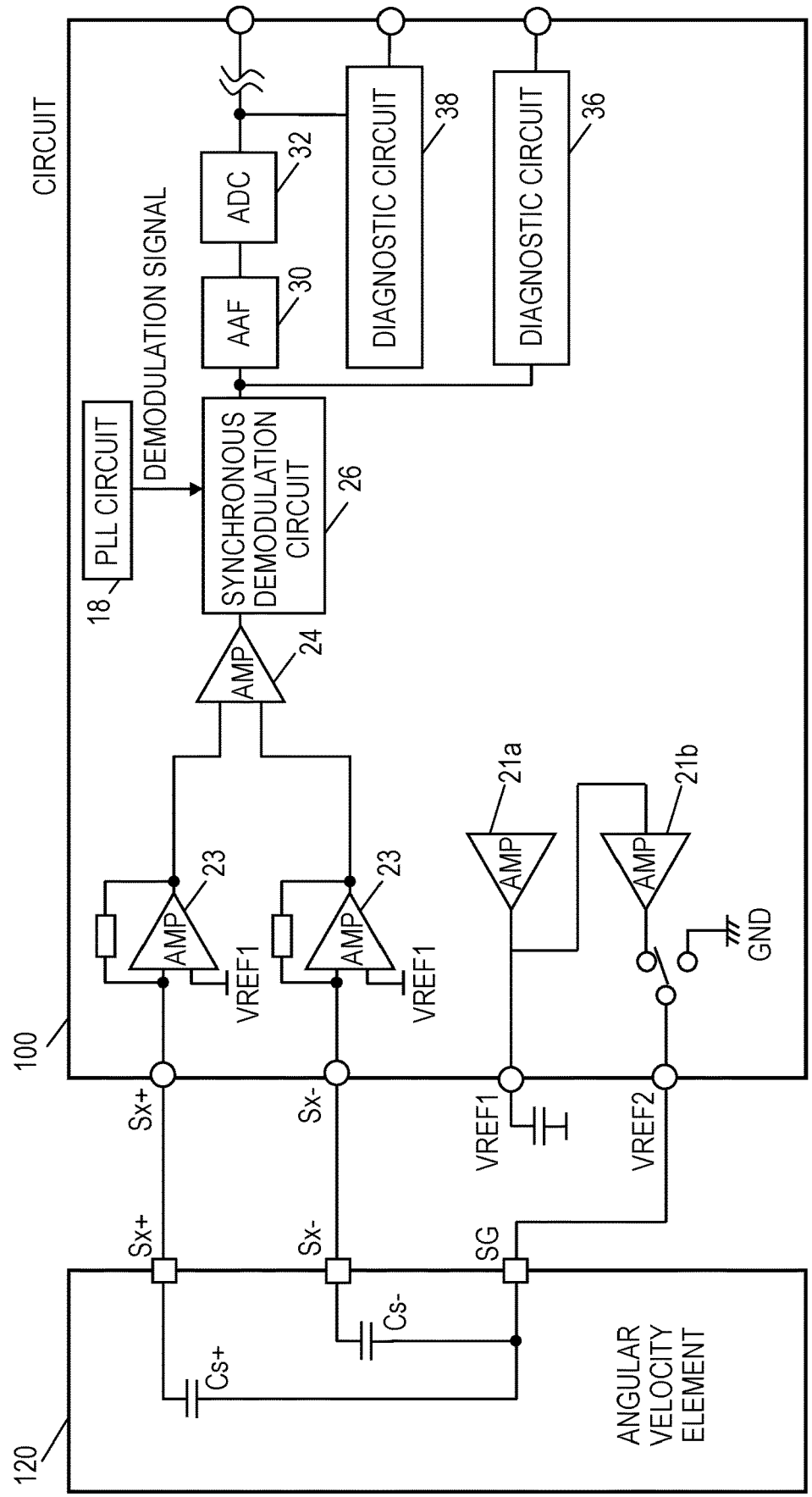
FIG. 5 is a block diagram illustrating in detail part of the configuration of the sensor according to the exemplary embodiment.

FIG. 5 is a block diagram illustrating in detail part of the configuration of the sensor according to the exemplary embodiment. FIGS. 6A to 6F are waveform charts of the detection signals. FIGS. 6A to 6F illustrate the angular velocity signal and the noise signal separately for easy description.

Figure 6A:
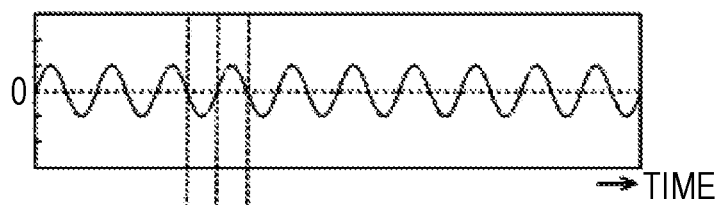
FIGS. 6A to 6F are waveform charts of detection signals.

First, the operation of the sensor according to the present exemplary embodiment will be described with reference to FIGS. 6A to 6F. FIG. 6A is a waveform of the angular velocity signal in the angular velocity detection signal before synchronous demodulation, FIG. 6B is the noise signal in the angular velocity detection signal before synchronous demodulation, FIG. 6C is the demodulation signal, FIG. 6D is the angular velocity signal in the angular velocity detection signal after synchronous demodulation, FIG. 6E is the noise signal in the angular velocity detection signal after synchronous demodulation, and FIG. 6F is a signal (that is, the angular velocity signal) after AM conversion (after filter processing).

Figure 6B:
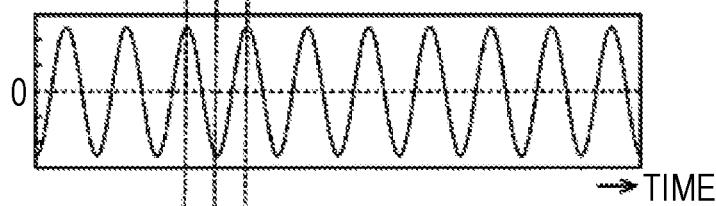
Figure 6C:
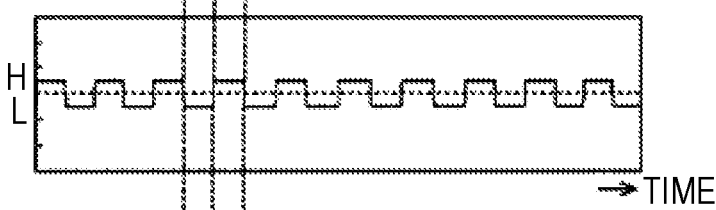

The angular velocity detection signal includes the angular velocity signal of FIG. 6A corresponding to the angular velocity applied to angular velocity element 120, and the noise signal of FIG. 6B that results from the aforementioned mechanical coupling (MC) of angular velocity element 120. Here, the noise signal is a signal having the phase almost equal to the phase of the driving signal, that is, the noise signal is a signal 90° out of phase with the angular velocity detection signal (the angular velocity detection signal, resulting from Coriolis force, is a signal 90° out of phase with the driving signal). For this reason, by performing synchronous demodulation on the angular velocity detection signal by using the demodulation signal of FIG. 6C with the phase almost identical to the phase of the angular velocity detection signal, only the angular velocity signal of FIG. 6D may be extracted.

Meanwhile, as illustrated in FIG. 5, circuit 100 includes diagnostic circuit 36 that receives a signal between synchronous demodulation circuit 26 and A/D conversion circuit 32, and diagnostic circuit 38 that receives the output from A/D conversion circuit 32.

Figure 6D:
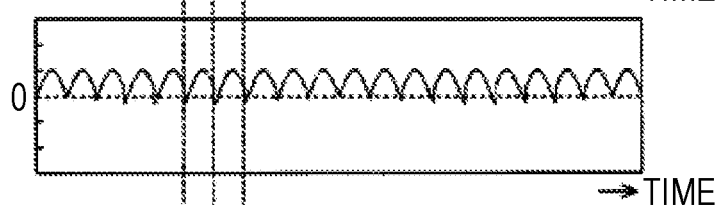
Figure 6E:
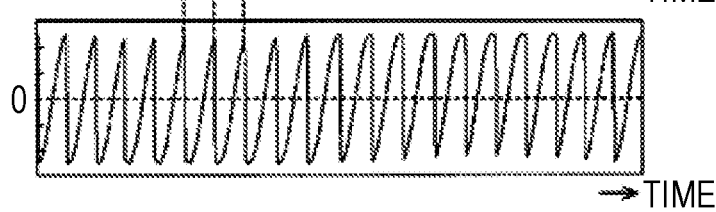
Figure 6F:
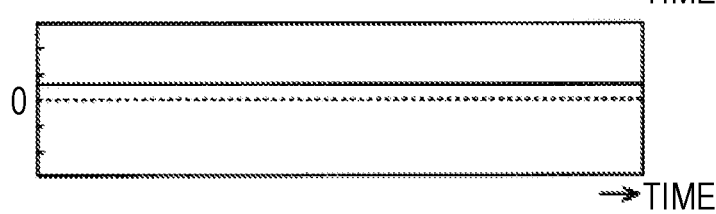

Diagnostic circuit 36 receives the signal that has passed through synchronous demodulation circuit 26, the signal having not passed through A/D conversion circuit 32 (the signal before smoothing processing is performed), in other words, diagnostic circuit 36 receives the signal obtained through addition of the signal of FIG. 6D to the signal of FIG. 6E. When a range (amplitude) of the input signal into diagnostic circuit 36 is equal to or greater than a predetermined value, diagnostic circuit 36 diagnoses that an abnormality occurs in the sensor, and outputs an error signal.

Diagnostic circuit 38 receives a signal that has passed through A/D conversion circuit 32 (a signal after smoothing processing is performed), in other words, the signal of FIG. 6F. When a range (amplitude) of the input signal into diagnostic circuit 38 is equal to or greater than a predetermined value, diagnostic circuit 38 diagnoses that an abnormality occurs in the sensor, and outputs an error signal. The "abnormality" mentioned here is, for example, an input of an excessive angular velocity signal, and a fault in various smoothing circuits including A/D conversion circuit 32. The "predetermined value" mentioned here may be defined as, for example, 90% of an output dynamic range (before saturation) of A/D conversion circuit 32.

As can be understood from FIGS. 6A to 6F and description related to FIGS. 6A to 6F, among the signals that are input into diagnostic circuit 36, the signal corresponding to the noise signal of FIG. 6E has a larger range (amplitude) than the signal corresponding to the angular velocity of FIG. 6D. Therefore, diagnostic circuit 36 may be described to be a circuit that operates to monitor the amplitude of the noise signal, and to diagnose that an abnormality occurs in the sensor when the amplitude of the noise signal becomes equal to or greater than a predetermined value. Meanwhile, diagnostic circuit 38 receives only the signal of FIG. 6F after A/D conversion (after filter processing). Therefore, diagnostic circuit 38 may be described to be a circuit that operates to monitor the amplitude of the angular velocity signal, and to diagnose that an abnormality occurs in the sensor when the amplitude of the angular velocity signal becomes equal to or greater than a predetermined value.

Meanwhile, diagnostic circuit 36 has a large threshold for determination used for diagnosis as compared with diagnostic circuit 38. This is because the unwanted signal is about 100 times to 1000 times larger than the angular velocity signal, and thus diagnostic circuit 36 preferably uses the threshold for determination used for diagnosis about 100 times large as compared with diagnostic circuit 38. Here, "the unwanted signal is about 100 times to 1000 times larger than the angular velocity signal" means, in other words, "a value (its unit is dps) obtained through conversion of the unwanted signal into the angular velocity is about 100 times to 1000 times larger than the angular velocity signal (its unit is dps)".

Thus, the sensor can diagnose with higher precision whether an excessive angular velocity is input, because the sensor includes diagnostic circuit 36 that receives the signal after synchronous demodulation and before passing through A/D conversion circuit 32 (smoothing), and diagnostic circuit 38 that receives the signal after passing through A/D conversion circuit 32 (smoothed). That is, a saturated signal that is input into synchronous demodulation circuit 26 breaks down vertical symmetry of the waveform, and prevents correct cancellation at a time of smoothing. Accordingly, even when the angular velocity is not applied to angular velocity element 120, an offset output is generated. In addition, the saturated signal that is input into synchronous demodulation circuit 26 causes a problem that the angular velocity detection signal may not pass through A/D conversion circuit 32, and that A/D conversion circuit 32 cannot output the correct angular velocity output signal. For this reason, monitoring the signal before passing through A/D conversion circuit 32 (before smoothing) may prevent occurrence of this problem.

Meanwhile, this method for diagnosis may also be described as follows. This method for diagnosis includes the steps of detecting the signal between synchronous demodulation circuit 26 and A/D conversion circuit 32, and detecting the signal that is output from A/D conversion circuit 32.

Figure 7:
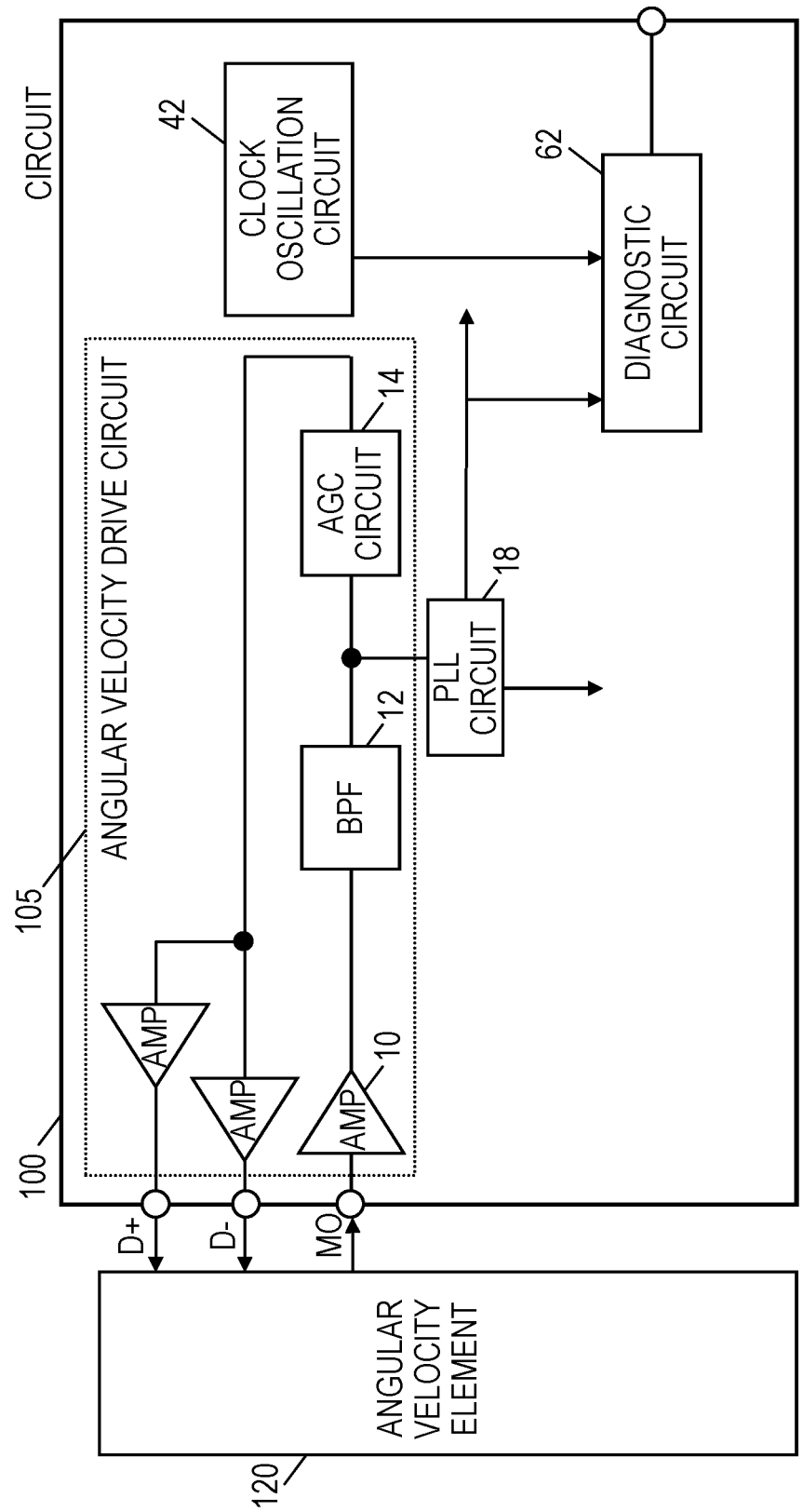
FIG. 7 is a block diagram illustrating in detail part of the configuration of the sensor according to the exemplary embodiment.
Figure 8A:
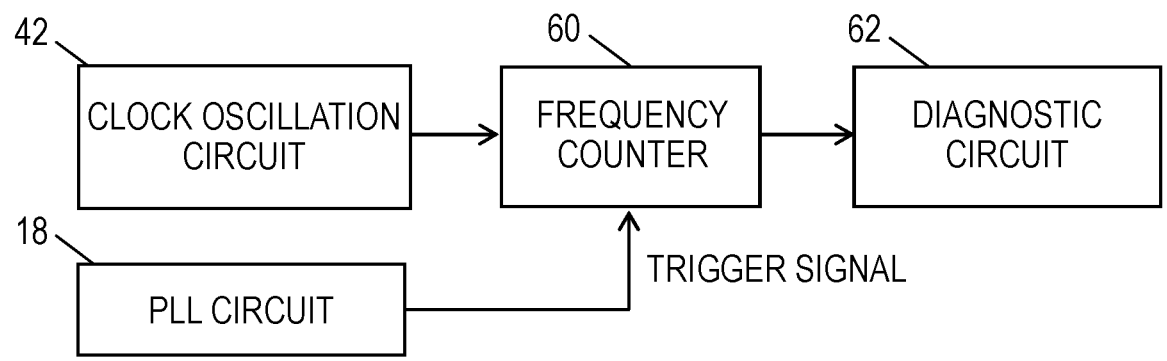
FIG. 8A is a block diagram illustrating a configuration of a frequency comparing circuit.
Figure 8B:
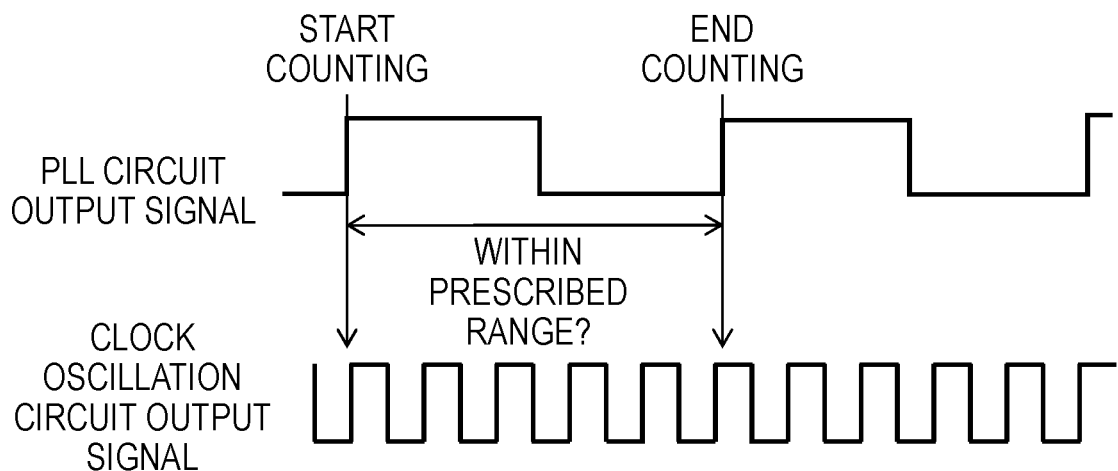
FIG. 8B is a waveform chart illustrating an operation of the frequency comparing circuit.

FIG. 7 is a block diagram illustrating in detail part of the configuration of the sensor according to the exemplary embodiment. FIG. 8A is a block diagram illustrating a configuration of a frequency comparing circuit. FIG. 8B is a waveform chart illustrating an operation of frequency counter 60.

As illustrated in FIG. 8A, circuit 100 includes PLL circuit 18 (first circuit), clock oscillation circuit 42 (second circuit) that generates an internal clock, frequency counter 60 that receives signals from PLL circuit 18 and clock oscillation circuit 42, and diagnostic circuit 62 that receives a signal from frequency counter 60. Here, PLL circuit 18 and clock oscillation circuit 42 are signal sources independent of each other (frequencies are not proportional).

Frequency counter 60 compares the frequency of the signal that is output from PLL circuit 18 with the frequency of the signal that is output from clock oscillation circuit 42, and then outputs a difference in the frequencies to diagnostic circuit 62.

Diagnostic circuit 62 monitors the difference in the frequency between the signal from PLL circuit 18 (hereinafter referred to as PLL circuit output signal) and the signal from clock oscillation circuit 42 (hereinafter referred to as clock oscillation circuit output signal). For example, when the frequency of the PLL circuit output signal is lower than the frequency of the clock oscillation circuit output signal, frequency counter 60 starts pulse counting of the clock oscillation circuit output signal at a timing of a rising edge of the PLL circuit output signal. Diagnostic circuit 62 then monitors whether the pulse count of the clock oscillation circuit output signal measured until a next rising edge of the PLL circuit output signal is equal to or less than a prescribed value. If the pulse count is equal to or less than the prescribed value, a frequency relationship between the PLL circuit output signal and the clock oscillation circuit output signal is normal, and thus diagnostic circuit 62 sets the error signal to a normal side. Here, diagnostic circuit 62 is preferably configured to set an initial value of the error signal to an abnormal side, and to set the error signal to a normal side after determination is made that the frequency relationship is normal. In other words, diagnostic circuit 62 is preferably configured to output the error signal before first counting of frequency counter 60 is completed. This enables detection of even stop of the PLL circuit output signal itself as an abnormality (for example, when a trigger signal that starts pulse counting is not obtained and counting itself does not start). Such a configuration enables determination of a fault even if either of the PLL circuit output signal and the clock oscillation circuit output signal is abnormal, and either fault of PLL circuit 18 and clock oscillation circuit 42 may be detected.

Meanwhile, Patent Literature 4 also discloses a method for diagnosis to compare frequencies between two signals. Specifically, this is a method for diagnosis to compare a signal obtained through frequency division of a clock (hereinafter referred to as signal A) with a signal obtained through frequency division of an output clock of a voltage controlled oscillator (hereinafter referred to as signal B), to diagnose presence of an abnormality. However, according to this method for diagnosis, since the signal B is a downstream signal of the signal A, in other words, since the signal B is a signal dependent on the signal A, in still other words, since the frequency of the signal B is proportional to the frequency of the signal A, an identical frequency abnormality may occur in the signal A and the signal B. Therefore, such an abnormality is not detected by the configuration described in Patent Literature 4.

In contrast, in the configuration of FIG. 7, since a comparison is made between a first signal and a second signal that are obtained from signal sources independent of each other (frequencies are not proportional), that is, between the PLL circuit output signal and the clock oscillation circuit output signal, an abnormality that occurs in the first signal does not affect the second signal, and it is possible to detect a fault that is not detected by the configuration of the prior art literature.

Meanwhile, this method for diagnosis may also be described as follows. This method for diagnosis includes the steps of detecting the difference between the frequency of the signal that is output from PLL circuit 18 and the frequency of the signal that is output from clock oscillation circuit 42, and outputting the error signal when the difference of these frequencies is equal to or greater than a predetermined value.

Figure 9:
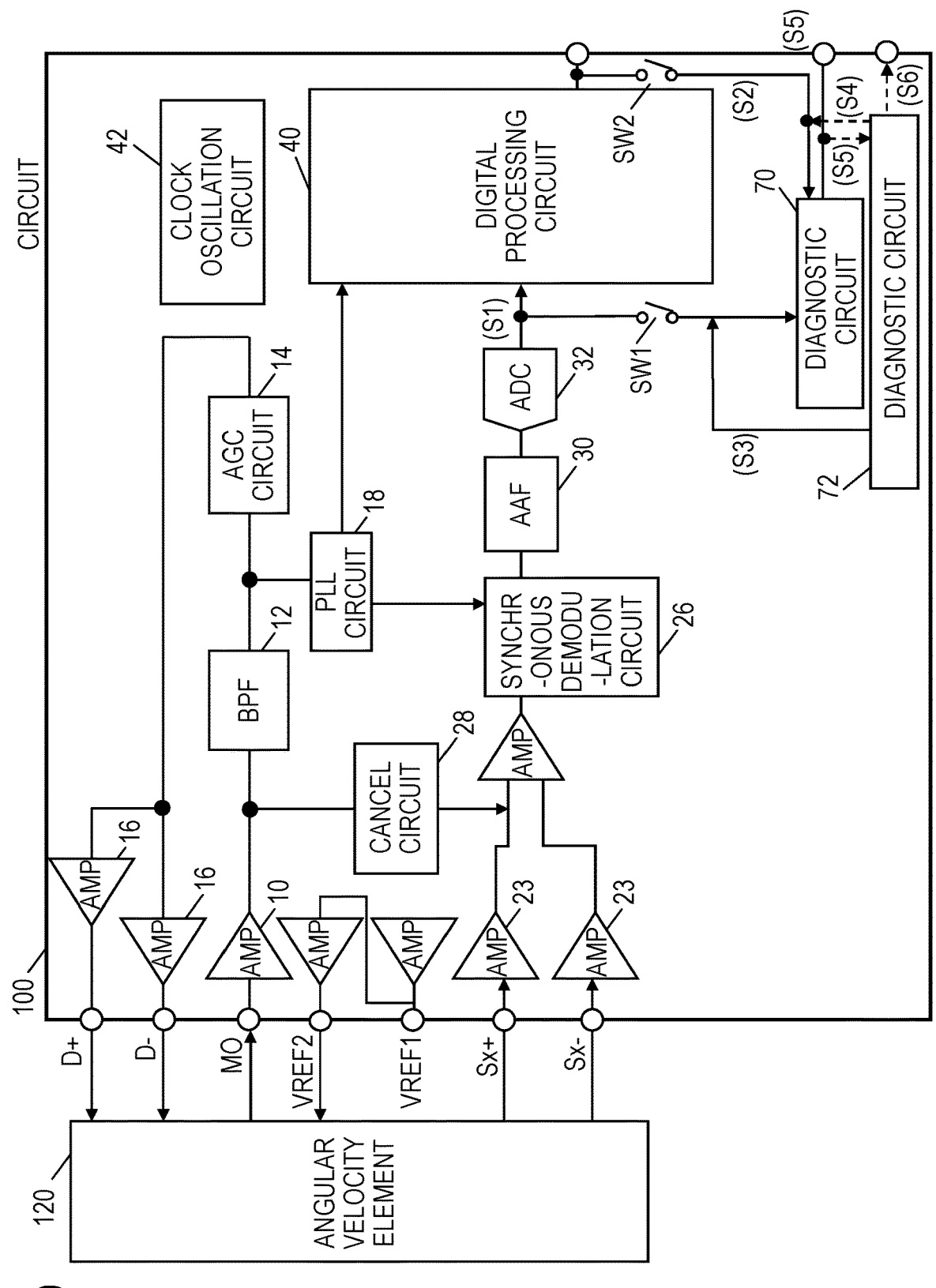
FIG. 9 is a block diagram illustrating in detail part of the configuration of the sensor according to the exemplary embodiment.

FIG. 9 is a block diagram illustrating in detail part of the configuration of the sensor according to the exemplary embodiment.

Diagnostic circuit 70 (first diagnostic circuit) diagnoses a fault of digital processing circuit 40.

Diagnostic circuit 72 (second diagnostic circuit) diagnoses a fault of diagnostic circuit 70. Specifically, in order to diagnose whether diagnostic circuit 70 can detect the fault that occurs in digital processing circuit 40, diagnostic circuit 72 creates a pseudo-fault state and diagnoses whether diagnostic circuit 70 can detect the fault state accurately. This will be described in detail.

First, while a normal detection operation is performed, a SW1 is closed, and diagnostic circuit 70 receives a signal S1 from A/D conversion circuit 32 (that is, a signal before being processed by digital processing circuit 40). At the same time, diagnostic circuit 70 receives a signal S2 after being processed by digital processing circuit 40. Diagnostic circuit 70 then detects the fault of digital processing circuit 40 based on a relationship between the signal S1 and the signal S2. In detail, when digital processing circuit 40 is operating normally, a specific relationship exists between the signal S1 that is input into digital processing circuit 40 and the signal S2 that is output from digital processing circuit 40 (in other words, a signal that should be output in response to a certain input signal is determined in advance). Therefore, diagnostic circuit 70 monitors whether digital processing circuit 40 is operating normally by monitoring whether this relationship is maintained. When the signal S1 and the signal S2 do not have the predetermined relationship, diagnostic circuit 70 outputs an error signal indicating occurrence of the fault in digital processing circuit 40.

While diagnostic circuit 72 is performing a diagnostic operation, the SW1 is open, and diagnostic circuit 70 receives a signal S3 from diagnostic circuit 72 (that is, diagnostic signal). At the same time, diagnostic circuit 70 receives the signal S2 after being processed by digital processing circuit 40. Here, the signal S3 is a signal having magnitude different from magnitude of the signal S1. The signal S3 is configured such that a combination of the signal S3 and signal S2 that are input into diagnostic circuit 70 departs from a normal relationship between an input into and output from digital processing circuit 40. Therefore, since diagnostic circuit 70 receives a combination of the signals that has an abnormal relationship between the input into and output from digital processing circuit 40, diagnostic circuit 70 determines that digital processing circuit 40 is out of order, and outputs an error signal S5. Diagnostic circuit 72 verifies whether diagnostic circuit 70 operates normally by monitoring whether diagnostic circuit 70 outputs the error signal S5.

Although description has been made that diagnostic circuit 72 verifies whether diagnostic circuit 70 operates normally by monitoring whether diagnostic circuit 70 outputs the error signal S5, the configuration of the sensor is not limited to this example. For example, the sensor may be configured to monitor whether the error signal S5 is output from outside.

Although description has been made that, while diagnostic circuit 72 is performing the diagnostic operation, the SW1 is open, and diagnostic circuit 70 receives the signal S3 from diagnostic circuit 72 (that is, diagnostic signal), the configuration of the sensor is not limited to this example. For example, the sensor may be configured such that, while diagnostic circuit 72 is performing the diagnostic operation, the SW2 is open, and diagnostic circuit 70 receives a signal S4 from diagnostic circuit 72 (that is, diagnostic signal). In this configuration, the SW1 and a signal path that conveys the signal S3 are unnecessary. In this configuration, diagnostic circuit 70 receives the signal S4 from diagnostic circuit 72 (that is, diagnostic signal). At the same time, diagnostic circuit 70 receives the signal S1 before being processed by digital processing circuit 40. Here, the signal S4 is a signal having magnitude different from magnitude of the signal S1. The signal S4 is configured such that a combination of the signal S1 and signal S4 that are input into diagnostic circuit 70 departs from the normal relationship between the input into and output from digital processing circuit 40. Therefore, since diagnostic circuit 70 receives the combination of the signals that has the abnormal relationship between the input into and output from digital processing circuit 40, diagnostic circuit 70 determines that digital processing circuit 40 is out of order, and outputs the error signal S5. Diagnostic circuit 72 verifies whether diagnostic circuit 70 operates normally by monitoring whether diagnostic circuit 70 outputs the error signal S5.

The operation of diagnostic circuit 72 may also be described as follows.

Diagnostic circuit 72 outputs the diagnostic signal (that is, the signal S3 or signal S4) to diagnostic circuit 70, instead of the signal that is input into digital processing circuit 40 (signal S1) or instead of the signal that is output from digital processing circuit 40 (signal S2). Here, when the diagnostic signal (S3) is output into diagnostic circuit 70 instead of the signal that is input into digital processing circuit 40 (signal S1), the combination of the diagnostic signal (S3) and the signal that is output from digital processing circuit 40 (S2) is set to a combination in which diagnostic circuit 70 outputs the error signal S5. In contrast, when the diagnostic signal (S4) is output into diagnostic circuit 70 instead of the signal that is output from digital processing circuit 40 (S2), the combination of the diagnostic signal (S4) and the signal that is input into digital processing circuit 40 is set to the combination in which diagnostic circuit 70 outputs the error signal (S5).

Thus, diagnostic circuit 72 intentionally creates a state of outputting the error signal of digital processing circuit 40, and then diagnostic circuit 72 diagnoses whether diagnostic circuit 70 determines an abnormality accurately at this time.

In particular, it is preferable to provide diagnostic circuit 72 in a component in which a single point fault occurs. The single point fault refers to a fault in which a single fault causes an abnormality in the sensor and the fault may not be detected or notified. Basically, diagnostic circuit 70 (first diagnostic circuit) is provided at a place where the single point fault occurs to detect the fault. However, a fault that occurs in diagnostic circuit 70 (first diagnostic circuit) earlier than in a circuit to be diagnosed prevents detection of the fault that subsequently occurs in the circuit to be diagnosed. Therefore, providing diagnostic circuit 72 that diagnoses diagnostic circuit 70 may increase sensor safety.

In the sensor according to the present exemplary embodiment, examples of the component that causes the single point fault include digital processing circuit 40. A fault in digital processing circuit 40 leads to abnormal calculation on the angular velocity signal that is input into digital processing circuit 40 (offset adjustment, gain adjustment, digital filter calculation, and the like), and thus an accurate sensor output signal may not be output.

Figure 10:
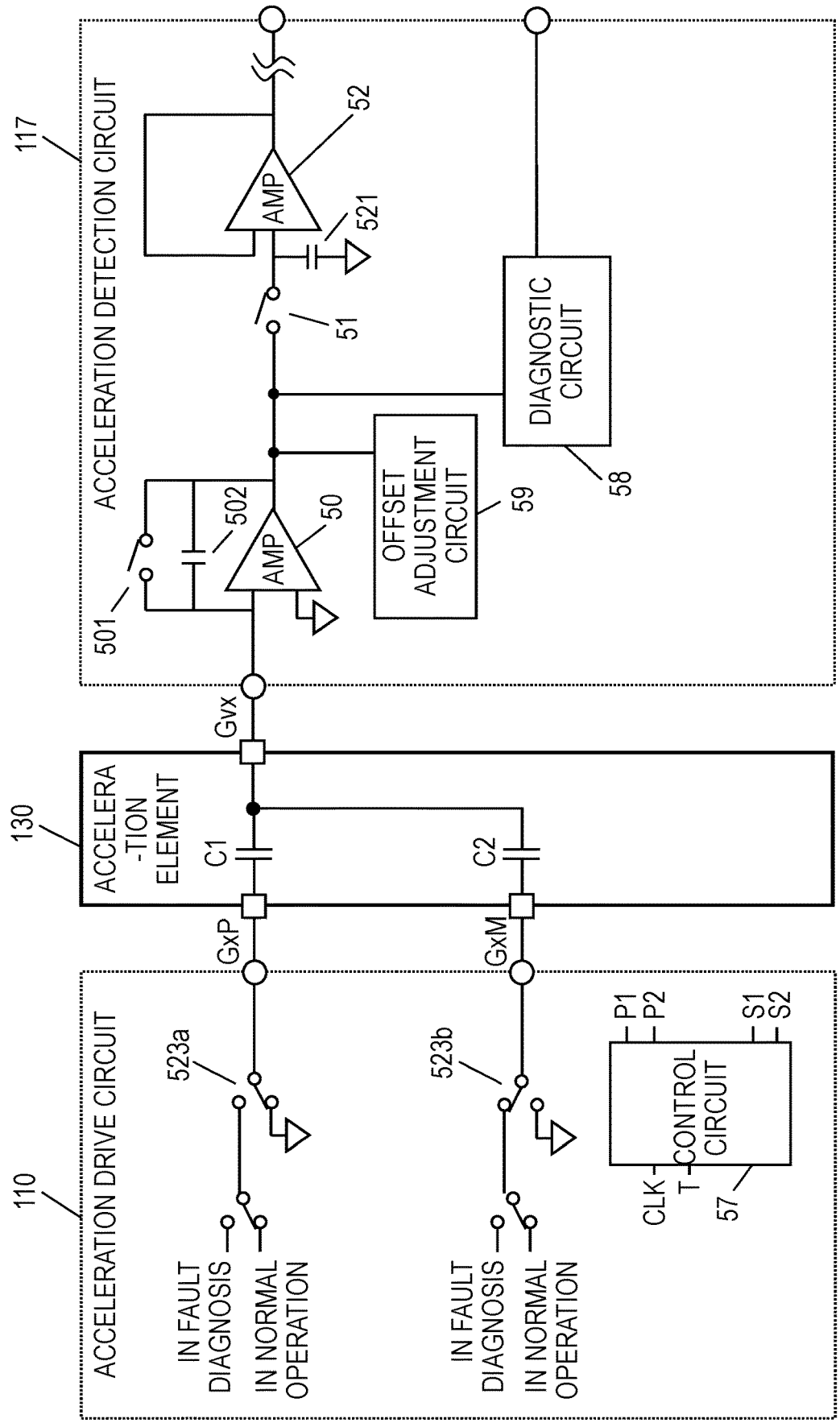
FIG. 10 is a block diagram illustrating in detail part of the configuration of the sensor according to the exemplary embodiment.
Figure 11:
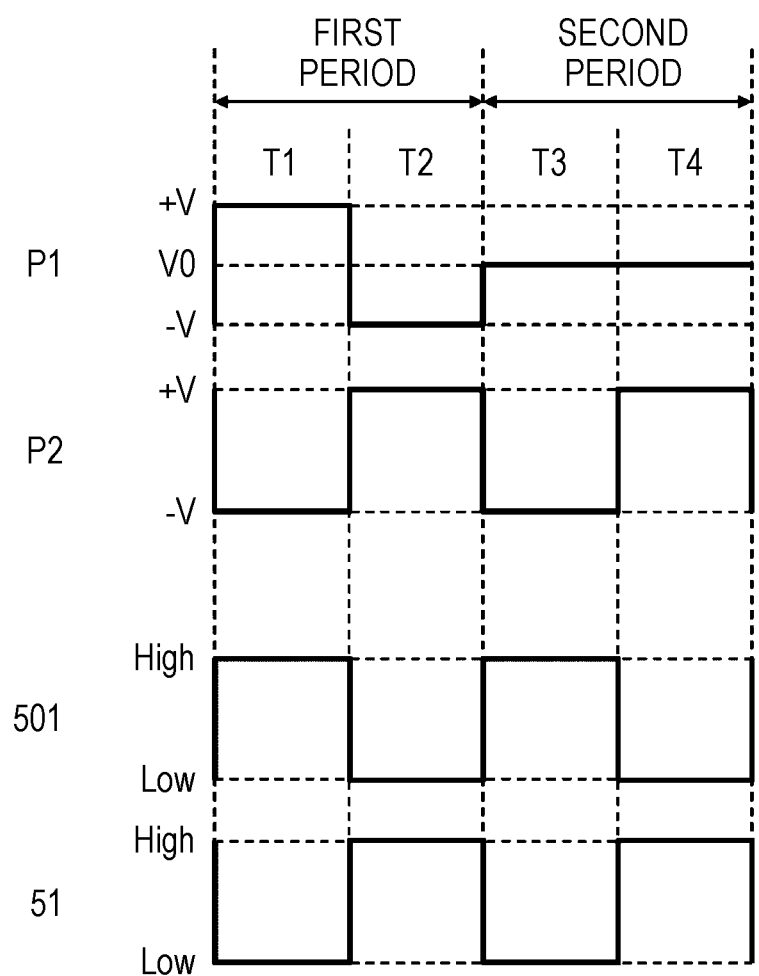
FIG. 11 is a waveform chart illustrating an operation of an acceleration drive circuit.

FIG. 10 is a block diagram illustrating in detail part of the configuration of the sensor according to the exemplary embodiment. FIG. 11 is a waveform chart illustrating an operation of the acceleration drive circuit.

Amplifier 50 receives the acceleration detection signal from an acceleration detection element, and performs voltage conversion on the acceleration detection signal. Amplifier 50 constitutes a CV conversion circuit.

Amplifier 52 samples (measures) an output voltage of amplifier 50, and then holds the voltage for a predetermined period. That is, amplifier 52 constitutes a sample and hold circuit.

Based on a reference clock CLK and a fault diagnosis signal T, control circuit 57 generates carrier signals P1, P2 and switch signals S1, S2, and then outputs these signals. The carrier signal P1 (first signal) is a signal of amplitude ±V that is input into stationary electrode 133a. The carrier signal P2 (second signal) is a signal of amplitude ±V that is input into stationary electrode 133b. The switch signal S1 is a signal that causes switch 501 to open and close. The switch signal S2 is a signal that causes switch 51 to open and close. Switch 501 and switch 51 are configured using a semiconductor switch and the like, and will close when the switch signals from control circuit 57 are high-level.

A reference numeral P1 of FIG. 11 represents the carrier signal P1 that is input into stationary electrode 133a. A reference numeral P2 of FIG. 11 represents the carrier signal P2 that is input into stationary electrode 133b. A reference numeral 501 of FIG. 11 represents timing of opening and closing of switch 501. A reference numeral 51 of FIG. 11 represents timing of opening and closing of switch 51.

During a first period T1, T2, a capacitance change is measured that occurs in acceleration element 130 according to input acceleration. Then, during a second period T3, T4, determination is made whether the signal path is broken between acceleration drive circuit 115 and acceleration element 130. Here, the first period is denoted as "normal period", and the second period is denoted as "fault diagnosis period".

Control circuit 57 outputs the carrier signal P1 and the carrier signal P2. The carrier signal P1 is a constant-amplitude rectangular wave signal with a high level (+V) and low level (−V) changing during the first period T1, T2. The carrier signal P2 is a signal with a voltage level inverted with respect to the carrier signal P1 during the first period T1, T2.

During the first period T1, the carrier signal P1 is +V, and the carrier signal P2 is −V. The switch signals S1, S2 from control circuit 57 cause switch 501 to close (HIGH) and switch 51 to open (LOW), respectively. This causes a voltage of V0 to be applied to a non-inverting input terminal of amplifier 50 and to movable electrode 132c, and this causes an electric charge of capacitance 502 to be discharged. In measurement during a normal operation, switch 523a and switch 523b are not connected to reference voltage V0, but are connected so as to input the carrier signals P1, P2 into movable electrode 132c.

In this state, an electric charge $Q1=-C1\times V$ accumulates between movable electrode 132c and stationary electrode 133a. A symbol of "−" means that a negative electric charge accumulates on a surface of movable electrode 132c facing stationary electrode 133a. In addition, an electric charge $Q2=+C2\times V$ accumulates between movable electrode 132c and stationary electrode 133b. A symbol of "+" means that a positive electric charge accumulates on the surface of movable electrode 132c facing stationary electrode 133b. A total amount of the electric charge of movable electrode 132c, which is a total value of Q1 and Q2, becomes $Q1+Q2=(C2-C1)\times V$.

During the first period T2, the voltage levels of the carrier signals P1, P2 are inverted, P1 becomes −V, P2 becomes +V, switch 501 opens, and switch 51 closes.

At this time, an electric charge $Q1'=+C1\times V$ accumulates between movable electrode 132c and stationary electrode 133a, and an electric charge $Q2'=-C2\times V$ accumulates between movable electrode 132c and stationary electrode 133b. The total amount of the electric charge of movable electrode 132c, which is a total value of Q1' and Q2', becomes $Q1'+Q2'=(C1-C2)\times V$.

A difference $\Delta Q$ between the electric charge (Q1+Q2) that accumulates in movable electrode 132c during T1 and the electric charge (Q1'+Q2') that accumulates in movable electrode 132c during T2 is $\Delta Q=(Q1+Q2)-(Q1'+Q2')=-(C1-C2)\times 2V$.

When differential capacitance C1 differs from differential capacitance C2, the electric charge $\Delta Q$ will be generated in movable electrode 132c.

However, since a function of amplifier 50 holds the voltage of movable electrode 132c at V0, the electric charge of $\Delta Q$ accumulates on a movable electrode 132c side of capacitance 502, and the electric charge $\Delta Q'=(C1-C2)\times 2V$ of inversed polarity accumulates on an opposite electrode of capacitance 502. As a result, when the capacitance of capacitance 502 is Cf, a voltage of $\Delta Q'/Cf=(C1-C2)\times 2V/Cf$ is generated at an output terminal of amplifier 50, and a voltage according to a difference in the capacitance (C1−C2) is output.

Amplifier 52 operates to sample (measure) the output voltage of amplifier 50 during the period T2, and to hold the sampled voltage during the other period (that is, to perform sample and hold). The output voltage from amplifier 52 is then processed, such as amplified, and becomes the acceleration signal.

Next, an operation of fault diagnosis will be described.

In fault diagnosis, during the second period T3, T4, either of switch 523a and switch 523b is switched to connect to reference voltage V0.

As an example, the following describes a case where switch 523a is connected to reference voltage V0. In this state, during the second period T3, both voltages of movable electrode 132c and stationary electrode 133a are V0. Since a voltage difference is zero, the electric charge Q1 is also zero. In contrast, the electric charge $Q2=+C2\times V$ accumulates between movable electrode 132c and stationary electrode 133b, as during the first period T1. Accordingly, the total amount of electric charge of movable electrode 132c becomes $Q1+Q2=0+C2\times V=C2\times V$.

During the second period T4, the electric charge Q1' is zero as during the second period T3, and the electric charge Q2' becomes $Q2'=-C2\times V$ as during the first period T2. Accordingly, the total amount of electric charge of movable electrode 132c becomes $Q1'+Q2'=0-C2\times V=-C2\times V$.

The difference $\Delta Q$ between the electric charge (Q1+Q2) that accumulates in movable electrode 132c during T3, and the electric charge (Q1'+Q2') that accumulates in movable electrode 132c during T4 becomes $\Delta Q=(Q1+Q2)-(Q1'+Q2')=C2\times 2V$. As a result, a voltage of $-\Delta Q/Cf=-C2\times 2V/Cf$ is generated at the output terminal of amplifier 50.

When the signal path is normal, the output voltage of amplifier 50 is −C2×2 V/Cf. However, when the signal path is broken, the output of amplifier 50 is zero. Therefore, the sensor can determine whether the signal path is broken, by determining with the diagnostic circuit whether the output voltage of amplifier 50 exceeds a predetermined threshold. In addition, according to this configuration, since C2 does not become zero even when acceleration applied to acceleration element 130 is zero, the output voltage of amplifier 50 during normal time (−C2×2 V/Cf) may be discriminated from the output voltage of amplifier 50 when the signal path is broken (zero).

As described above, the sensor according to the present exemplary embodiment performs the normal operation of measuring the change in the capacitance according to input physical quantity during the first period T1, T2. During the second period T3, T4, the sensor according to the present exemplary embodiment performs the fault diagnosis operation for determining whether the signal path to a capacitance detection unit is broken. This allows the sensor to perform the fault diagnosis without displacing the movable electrode, and to shorten time of the fault diagnosis.

Meanwhile, acceleration detection circuit 117 includes offset adjustment circuit 59 downstream of amplifier 50. Offset adjustment circuit 59 preferably operates during the first period, and stops during the second period. That is, offset adjustment circuit 59 is configured to cancel an offset amount of amplifier 50 in the first period. However, since the offset amount of amplifier 50 has a different value during the second period, by stopping offset adjustment during the second period, offset adjustment circuit 59 can avoid wrong detection made by diagnostic circuit 58 according to the offset adjustment. The "offset" mentioned here means an amount of offset voltage that appears in the output of amplifier 50. This amount of offset voltage is a signal obtained through addition of the offset signal from acceleration element 130 to the offset signal generated in amplifier 50 itself. This amount of offset voltage is canceled during the first period by offset adjustment circuit 59 including a D/A converter, current input circuit, and the like.

Although the sensor is configured such that offset adjustment circuit 59 is provided downstream of amplifier 50 in FIG. 10, the sensor configuration is not limit to this example. For example, offset adjustment circuit 59 may be provided upstream of amplifier 50.

Figure 12:
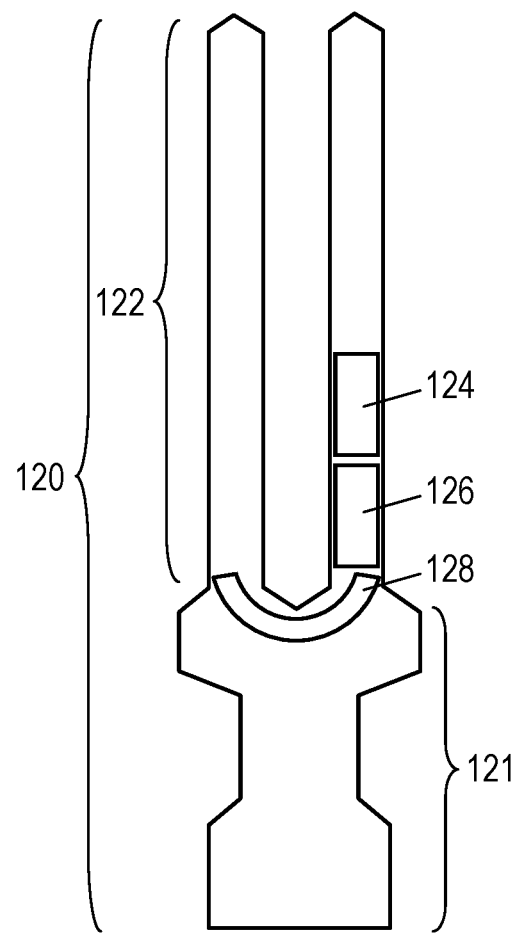
FIG. 12 is a plan view illustrating an angular velocity element included in the sensor according to the present exemplary embodiment.

FIG. 12 is a front view illustrating the angular velocity element included in the sensor according to the exemplary embodiment.

Angular velocity element 120 is a structure having a pair of arms 122 in support section 121, and is an element having a piezoelectric substance.

Angular velocity element 120 includes drive electrode 126 that receives the driving signal for causing angular velocity element 120 to oscillate at a specific frequency, monitor electrode 128 that detects an oscillation frequency of angular velocity element 120 and outputs the oscillation frequency as the monitor signal, and detection electrode 124 that outputs the detection signal that is generated from the angular velocity provided to angular velocity element 120, the detection signal being synchronized with the monitor signal. Drive electrode 126 and detection electrode 124 are formed in one of arms 122, and monitor electrode 128 is formed in a vicinity of a boundary of support section 121 and arms 122.

FIG. 13 is an exploded perspective view illustrating the acceleration element included in the sensor according to the exemplary embodiment.

Acceleration element 130 includes acceleration sensor substrate 132, top cover 133, and bottom cover 134. Acceleration sensor substrate 132 is held between top cover 133 and bottom cover 134. Acceleration sensor substrate 132 includes beam 132a, beam 132b, movable electrode 132c, and frame section 132d. Stationary electrode 133a (first stationary electrode) and stationary electrode 133b (second stationary electrode) are formed in top cover 133. Stationary electrode 133a is disposed facing a first place of movable electrode 132c. Stationary electrode 133b is disposed facing a second place of movable electrode 132c. Movable electrode 132c is displaced according to a change in physical quantity. First stationary electrode 133a is disposed facing the first place of movable electrode 132c. Second stationary electrode 133b is disposed facing the second place of movable electrode 132c.

It is to be noted that although the present exemplary embodiment has described the sensor equipped with the angular velocity element (and a section for drive and detection of the element) and the acceleration element (and a section for drive and detection of the element), the sensor according to the present exemplary embodiment is not limited to this example. For example, a sensor may be used including only the angular velocity element (and a section for drive and detection of the element), or a sensor may be used including only the acceleration element (and a section for drive and detection of the element).

Although the present exemplary embodiment has described the one-axis angular velocity element and the one-axis acceleration element, the angular velocity element and the acceleration element are not limited to this example. For example, a three-axis angular velocity element and a three-axis acceleration element may be used.

Although the present exemplary embodiment has described that the piezoelectric substance is used for detection of the angular velocity, the method for detecting the angular velocity is not limited to this example. For example, capacitance may be used for detection.

Although the present exemplary embodiment has described the tuning fork-type angular velocity element, the angular velocity element is not limited to this example. Various angular velocity elements may be used as long as the elements are an oscillation-type angular velocity element, for example, an double T-Shaped element.

Although the present exemplary embodiment has described the acceleration element as a structure in which a weight is supported by a beam (bulk method or torsion method), the acceleration element is not limited to this example. Various acceleration elements may be used as long as the elements are a capacitive element, for example, an interdigital element and a surface type acceleration element.

The configurations illustrated in FIG. 3, FIG. 4, FIG. 5, FIG. 7, and FIG. 9 may be used overlapping in one sensor, and only part of the configurations may be used.

In the present exemplary embodiment, a term "identical" does not mean being physically completely identical. This term includes an error, and further includes a difference of a degree that may be regarded as being practically identical.

The sensor of the present disclosure is useful as a vehicle sensor and the like.

What is claimed is:

1. A sensor comprising:
    an element that outputs a detection signal according to magnitude of an angular velocity; a drive circuit that outputs a driving signal to the element and receives a monitor signal from the element;
    a detection circuit including an amplifier that amplifies the detection signal, and a first synchronous demodulation circuit that performs synchronous demodulation on a signal from the amplifier, the detection circuit receiving the detection signal and outputting an angular velocity signal according to the angular velocity;
    a processing circuit that processes a signal from the first synchronous demodulation circuit; a first diagnostic circuit that receives a signal that is input into the processing circuit and a signal that is output from the processing circuit, the first diagnostic circuit outputting an error signal when an abnormality occurs in the processing circuit; and a second diagnostic circuit,
    wherein when the first diagnostic circuit outputs the first error signal, the second diagnostic circuit either: (a) outputs a first diagnostic signal to the first diagnostic circuit in place of the signal that is input into the processing circuit, or (b) outputs a second diagnostic signal in place of the signal that is output from the processing circuit,
    when the first diagnostic signal is input into the first diagnostic circuit, the first diagnostic circuit receives the first diagnostic signal and the signal output by the processing circuit, and the first diagnostic circuit outputs the error signal if an error has occurred in the first diagnostic circuit utilizing the first diagnostic signal and the signal that is output from the processing circuit, and
    when the second diagnostic signal is input into the first diagnostic circuit, the first diagnostic circuit receives the signal input to the processing circuit and the second diagnostic signal, and the first diagnostic circuit outputs the error signal if an error has occurred in the first diagnostic circuit utilizing the second diagnostic signal and the signal that is input to the processing circuit.

2. The sensor according to claim 1, wherein
when the first diagnostic signal is input to the first diagnostic circuit, a combination of the first diagnostic signal and the signal that is output from the processing circuit is set to a combination in which the first diagnostic circuit outputs the error signal, and
when the second diagnostic signal is input to the first diagnostic circuit, a combination of the diagnostic signal and the signal that is input into the processing circuit is set to the combination in which the first diagnostic circuit outputs the error signal.

3. The sensor according to claim 1, wherein the abnormality is a single point fault.

4. The sensor according to claim 1, wherein the detection circuit further includes:
a first circuit that receives a signal from the drive circuit;
a second circuit that receives a signal from the first circuit;
a frequency counter that detects a difference between a frequency of the signal from the first circuit and a frequency of a signal from the second circuit; and
a third diagnostic circuit that receives a signal from the frequency counter.

5. The sensor according to claim 4, wherein the first circuit and the second circuit are signal sources independent of each other.

6. The sensor according to claim 4, wherein, when the difference between the frequency of the signal that is input from the first circuit and the frequency of the signal that is input from the second circuit is equal to or greater than a predetermined value, the third diagnostic circuit outputs a third error signal.

7. The sensor according to claim 6, wherein the third diagnostic circuit outputs the third error signal before the frequency counter completes first counting.

8. The sensor according to claim 4, wherein
the first circuit is a phase-locked loop (PLL) circuit that multiplies the frequency of the signal that is input from the drive circuit, and
the second circuit is a clock oscillation circuit that generates an internal clock for the detection circuit.

9. The sensor according to claim 1, wherein the detection circuit further includes:
a first analog-to-digital (A/D) conversion circuit that performs A/D conversion on the signal from the first synchronous demodulation circuit;
a third diagnostic circuit that receives a signal between the first synchronous demodulation circuit and the first A/D conversion circuit; and
a fourth diagnostic circuit that receives a signal that is output from the first A/D conversion circuit.

10. The sensor according to claim 9, wherein
the third diagnostic circuit outputs a third error signal when a voltage level of the signal between the first synchronous demodulation circuit and the first A/D conversion circuit exceeds a first threshold,
the fourth diagnostic circuit outputs a fourth error signal when a voltage level of the signal that is output from the first A/D conversion circuit exceeds a second threshold, and
the first threshold is larger than the second threshold.

11. The sensor according to claim 9, wherein
the detection circuit further includes a filter circuit between the first synchronous demodulation circuit and the first A/D conversion circuit, and
the third diagnostic circuit is provided between the first synchronous demodulation circuit and the filter circuit.

12. The sensor according to claim 1, wherein the detection circuit further includes:
a cancel circuit that adds a cancel signal to the signal that is output from the amplifier;
a second synchronous demodulation circuit that performs synchronous demodulation on a signal to which the cancel signal has been added, by using a signal 90° out of phase with a demodulation signal used for synchronous demodulation by the first synchronous demodulation circuit; and
a third diagnostic circuit that receives a signal that is output from the second synchronous demodulation circuit.

13. The sensor according to claim 12, wherein the detection circuit further includes:
a first A/D conversion circuit that receives the signal from the first synchronous demodulation circuit; and
a second A/D conversion circuit that receives the signal from the second synchronous demodulation circuit,
wherein a number of bits of the second A/D conversion circuit is smaller than a number of bits of the first A/D conversion circuit.

14. The sensor according to claim 1, wherein
the drive circuit further includes a first amplifier that provides a first voltage, and a second amplifier that provides a second voltage to the element, and
the sensor further comprises a first path that provides the second voltage to the element, and a second path that provides the second voltage to the element.

15. The sensor according to claim 1, wherein
the drive circuit further includes:
a first amplifier that provides a first voltage;
a second amplifier that provides a second voltage;
a switch that generates a pulse voltage from the second voltage and a ground voltage; and
a third diagnostic circuit that makes a diagnosis based on an electric change that occurs in the detection circuit when the pulse voltage is applied to the element.

16. A method for diagnosing a sensor including:
an element that outputs a detection signal according to magnitude of an angular velocity;
a drive circuit that outputs a driving signal to the element;
a detection circuit that receives the detection signal, includes a first synchronous demodulation circuit that performs synchronous demodulation on the detection signal, and outputs an angular velocity signal according to the angular velocity, the detection circuit further includes a phase lock loop circuit that receives a signal from the drive circuit, a clock oscillation circuit, and a frequency counter that compares the frequency of a signal that is output from the phase lock loop circuit with the frequency of a signal that is output from clock oscillation circuit;
a processing circuit that processes a signal from the first synchronous demodulation circuit; and
a first diagnostic circuit that receives a signal that is input into the processing circuit and a signal that is output from the detection circuit, the first diagnostic circuit outputting an error signal when an abnormality occurs in the detection circuit, wherein
the first diagnostic circuit receives the angular velocity signal through the angular velocity element and a band pass filter, the method comprising the steps of:
- outputting a diagnostic signal to the processing circuit;
- setting a prescribed value including an initial value of the error signal;
- counting the frequency of the clock oscillation circuit using the frequency counter, the frequency counter starts pulse counting of the clock oscillation circuit output signal at a timing of a rising edge of the phase lock loop circuit;
- monitoring whether the pulse count of the clock oscillation circuit output signal measured until a next rising edge of the phase lock loop circuit output signal is equal to or less than a prescribed value using the first diagnostic circuit;
- detecting a difference between a frequency of the signal that is output from the phase lock loop circuit and a frequency of the signal that is output from the clock oscillation circuit; and
- outputting the error signal when the difference between the frequencies is equal to or greater than the prescribed value.

17. The method for diagnosing a sensor according to claim 16, wherein
the detection circuit includes:
- an amplifier that amplifies the detection signal;
- the first synchronous demodulation circuit that performs synchronous demodulation on a signal from the amplifier; and
- a first analog-to-digital (A/D) conversion circuit that performs A/D conversion on the signal from the first synchronous demodulation circuit, and the method further comprises the steps of:
- detecting a signal between the first synchronous demodulation circuit and the first A/D conversion circuit; and
- detecting a signal that is output from the first A/D conversion circuit.

18. The method for diagnosing a sensor according to claim 16, wherein
the detection circuit further includes:
- an amplifier that amplifies the detection signal; and
- the first synchronous demodulation circuit that performs synchronous demodulation by using a signal from the amplifier, and the method further comprises the steps of:
- adding a cancel signal to the signal that is output from the amplifier;
- performing synchronous demodulation on a signal obtained in the step of adding the cancel signal, by using a signal 90° out of phase with a signal used for synchronous demodulation by the first synchronous demodulation circuit; and
- detecting a voltage level of a signal obtained in the step of performing the synchronous demodulation.

* * * * *